United States Patent
Lohe et al.

(10) Patent No.: US 11,835,591 B2
(45) Date of Patent: *Dec. 5, 2023

(54) ELECTRIC AIRCRAFT BATTERY PACK AND METHODS OF USE

(71) Applicant: BETA AIR, LLC, South Burlington, VT (US)

(72) Inventors: Braedon Lohe, Essex Junction, VT (US); Cullen Jemison, Winooski, VT (US); Andrew Giroux, Georgia, VT (US); Tom Hughes, South Burlington, VT (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/529,653

(22) Filed: Nov. 18, 2021

(65) Prior Publication Data

US 2023/0251325 A1    Aug. 10, 2023

(51) Int. Cl.
*G01R 31/396* (2019.01)
*H01M 10/48* (2006.01)
*G01R 31/3835* (2019.01)
*B64D 27/24* (2006.01)

(52) U.S. Cl.
CPC ....... *G01R 31/396* (2019.01); *G01R 31/3835* (2019.01); *H01M 10/482* (2013.01); *B64D 27/24* (2013.01); *H01M 2220/20* (2013.01)

(58) Field of Classification Search
CPC ............. G01R 31/396; G01R 31/3835; H01M 10/482; H01M 2220/20; B64D 27/24
See application file for complete search history.

(56) References Cited

U.S. PATENT DOCUMENTS

| | | |
|---|---|---|
| 9,079,505 B1 | 7/2015 | Hyde |
| 9,846,199 B2 | 12/2017 | Vian |
| 10,023,057 B2 | 7/2018 | Sobota Rodriguez |
| 10,322,824 B1 * | 6/2019 | Demont ................ B60L 3/0061 |
| 11,065,979 B1 * | 7/2021 | Demont .................... H02P 3/18 |
| 11,476,676 B1 * | 10/2022 | Lohe .................. H02J 7/00032 |
| 11,549,994 B1 * | 1/2023 | Lohe ..................... B64D 27/24 |
| 2011/0248678 A1 | 10/2011 | Wade |

(Continued)

FOREIGN PATENT DOCUMENTS

| | | | | |
|---|---|---|---|---|
| CN | 111186585 A | * | 5/2020 | ............. B64D 27/24 |
| WO | WO 2019/211659 A1 | * | 11/2019 | ............. B60L 58/10 |
| WO | 2020243655 A1 | | 12/2020 | |

OTHER PUBLICATIONS

Askin T. in Optimization of Commercial Aircraft Using Battery-Based Voltaic-Joule/Brayton Propulsion, Journal Ofaircraft vol. 54, No. 1, Jan.-Feb. 2017, pp. 246-261 (Year: 2017).*

(Continued)

*Primary Examiner* — Tung S Lau
(74) *Attorney, Agent, or Firm* — CALDWELL INTELLECTUAL PROPERTY LAW

(57) ABSTRACT

An electric aircraft battery pack that includes an integrated battery management component, which determines if a power supply connection between the battery pack and the electric aircraft should be terminated due to a failure, defect, or malfunction of the battery pack, such as a failure of a battery module of the battery pack.

20 Claims, 9 Drawing Sheets

(56) References Cited

U.S. PATENT DOCUMENTS

| | | | |
|---|---|---|---|
| 2014/0339371 A1* | 11/2014 | Yates | B64D 5/00 |
| | | | 244/53 R |
| 2014/0351107 A1* | 11/2014 | Duncan | B60L 58/12 |
| | | | 701/2 |
| 2016/0288918 A1* | 10/2016 | Yates | B64D 27/24 |
| 2018/0043789 A1* | 2/2018 | Goetz | B60L 50/64 |
| 2019/0081364 A1 | 3/2019 | Capati | |
| 2019/0229650 A1* | 7/2019 | Demont | B60L 3/0061 |
| 2019/0337409 A1* | 11/2019 | Demont | B60L 58/18 |
| 2019/0339334 A1* | 11/2019 | Mikolajczak | G01R 31/371 |
| 2020/0274203 A1 | 8/2020 | Kirleis | |
| 2020/0282853 A1 | 9/2020 | Paryani | |
| 2020/0298728 A1* | 9/2020 | Demont | B60L 53/00 |
| 2021/0078714 A1 | 3/2021 | Demont | |

OTHER PUBLICATIONS

Askin T. in Conceptual Studies of Universally-Electric Systems Architectures Suitable for Transport Aircraft, Apr. 9, 2015, 17 pages (Year: 2015).*

Askin T. in Conceptual Studies of Future Hybrid-Electric Regional Aircraft, ISABE-2015-20285, pp. 1-20 (Year: 2015).*

UST, Battery Management Systems BMS & Battery Packs, Dec. 31, 2021.

Kim, Battery Balancing Algorithm for an Agricultural Drone Using a State-of-Charge-Based Fuzzy Controller, Dec. 31, 2020.

* cited by examiner

ELECTRIC AIRCRAFT BATTERY PACK AND METHODS OF USE

FIELD OF THE INVENTION

The present invention generally relates to the field of electric aircrafts. In particular, the present invention is directed to an electric aircraft battery pack and methods of use.

BACKGROUND

The burgeoning of electric vertical take-off and landing (eVTOL) aircraft technologies promises an unprecedented forward leap in energy efficiency, cost savings, and the potential of future autonomous and unmanned aircraft. However, the technology of eVTOL aircraft is still lacking in crucial areas of energy source solutions.

SUMMARY OF THE DISCLOSURE

In an aspect, a battery pack for an electric aircraft, the battery pack comprising: a battery module configured to provide energy to an electric aircraft via a power supply connection; a module monitor unit mechanically connected and communicatively connected to the battery module, wherein the module monitor unit is configured to transmit a measurement datum of a battery module; a pack monitoring unit communicatively connected to the module monitor unit, wherein the pack monitoring unit comprises a controller configured to: receive measurement datum from the monitoring module unit; identify an operating condition of the battery module as a function of the measurement datum; determine a critical event element if the operating condition is outside of a predetermined threshold; and generate an action command if the critical event element is determined; and a high voltage disconnect communicatively connected to the battery modules, wherein the high voltage disconnect is configured to terminate the power supply connection between the battery module and the electric aircraft in response to receiving an action command from the pack monitoring unit.

In an aspect, a method of battery pack management, the method including: providing the battery pack; transmitting, by a monitoring module unit, a measurement datum of a battery module of the battery pack; receiving, by a controller of the pack monitoring unit communicatively connected to monitoring module unit, the measurement datum from the monitoring module unit; identifying, by the controller, an operating condition of the battery module as a function of the measurement datum; determining, by the controller, a critical event element if the operating condition is outside of a predetermined threshold; and generating, by the controller, an action command if the critical event element is determined terminating, by a high voltage disconnect, a power supply connection between the battery module and the electric aircraft in response to receiving the action command from the pack monitoring unit.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

Battery management systems and related techniques are provided to improve the monitoring and controlling of an electric aircraft energy source. More specifically, a battery pack with a battery management component is provide, where the battery management component is configured to measure a condition parameter of one or more components of the battery pack to ensure the battery pack is operating properly and to prevent and/or reduce damage to the electric aircraft if the battery pack experiences a malfunction or catastrophic failure.

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply embodiments of the inventive concepts defined in the appended claims. Hence, specific dimensions and other physical characteristics relating to the embodiments disclosed herein are not to be considered as limiting, unless the claims expressly state otherwise.

Figure 1:
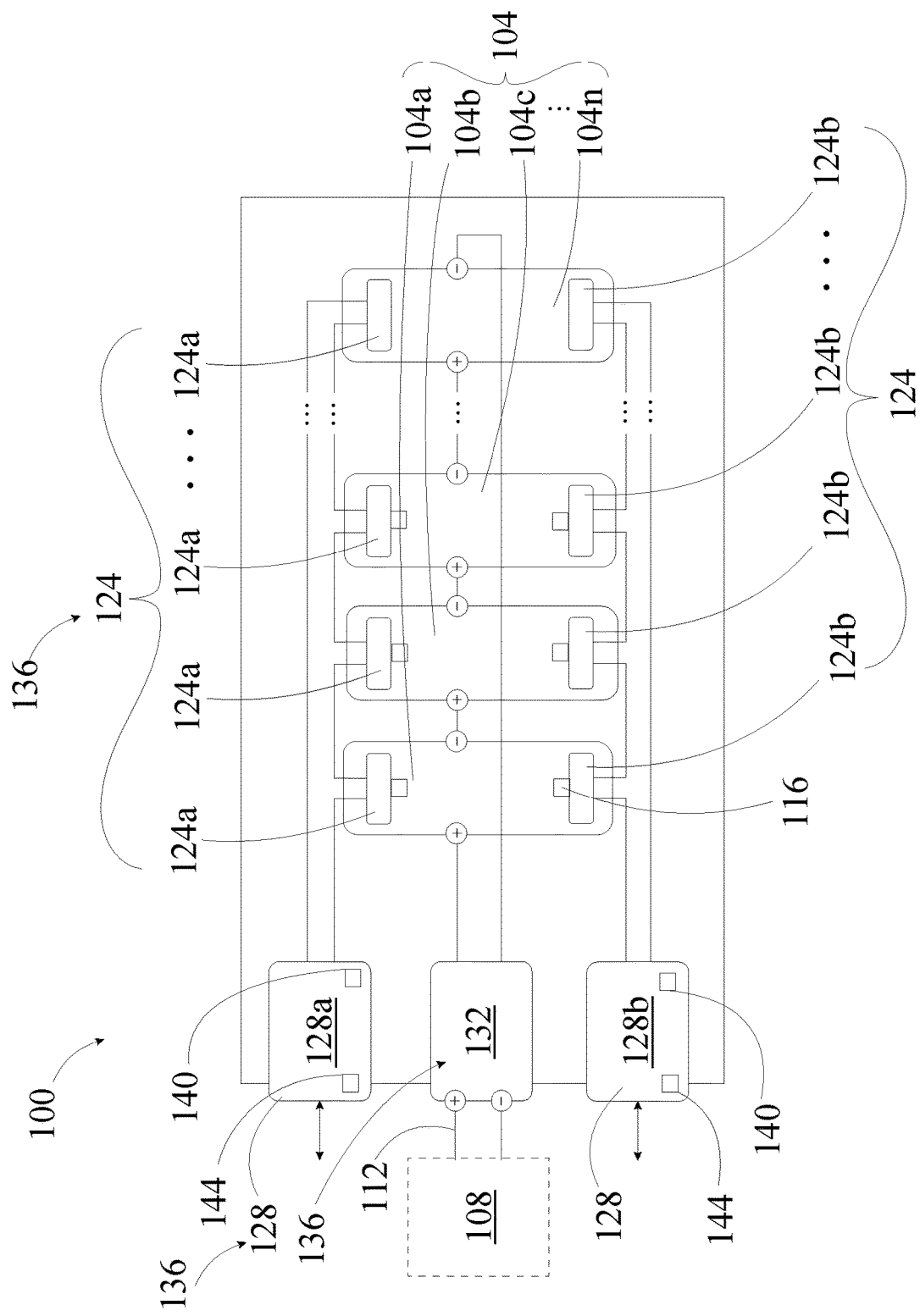
FIG. 1 is a block diagram of an exemplary embodiment of a battery pack in one or more aspects of the present disclosure.
Figure 3:
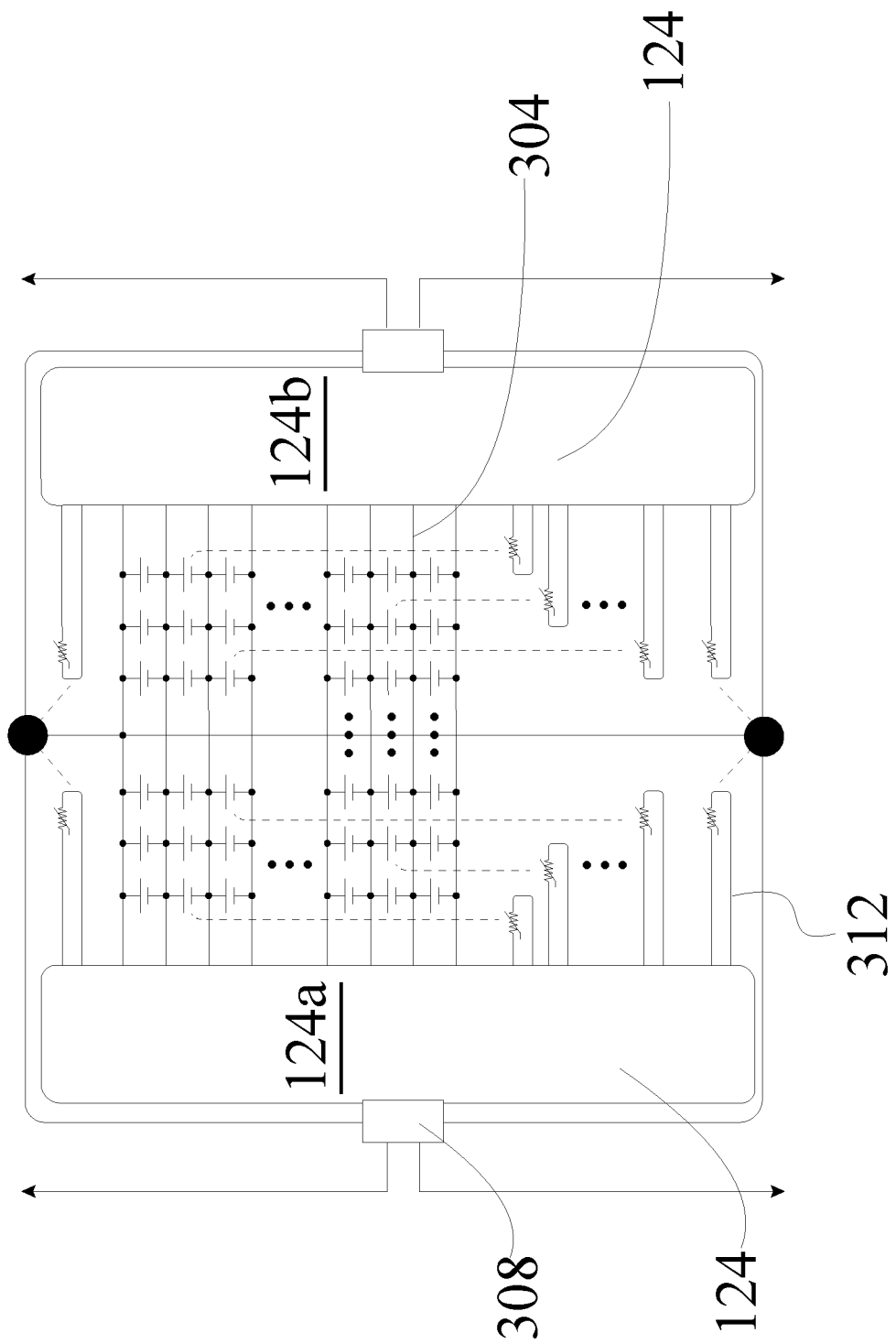
FIG. 3 is a block diagram of an exemplary embodiment of a module monitor unit in one or more aspect of the present disclosure.

Referring now to FIG. 1, an embodiment of a battery pack 100 is presented in accordance with one or more embodiments of the present disclosure. In one or more embodiments, electric aircraft battery pack 100 (also referred to herein as a "battery pack") includes a battery module 104, which is configured to provide energy to an electric aircraft 108 via a power supply connection 112. For the purposes of this disclosure, a "power supply connection" is an electrical and/or physical communication between a battery module 104 and electric aircraft 108 that powers electric aircraft 108 and/or electric aircraft subsystems for operation. In one or more embodiments, battery pack 100 may include a plurality of battery modules, such as modules 104a-n. For example, and without limitation, battery pack 100 may include fourteen battery modules. In one or more embodiments, each battery module 104a-n may include a battery cell 304, as shown in FIGS. 3 and 5B. For example, and without limitation, battery module 104 may include a plurality of battery cells.

Still referring to FIG. 1, battery pack 100 includes a battery management component 136 (also referred to herein as a "management component"). In one or more embodiments, battery management component 136 may be integrated into battery pack 100 in a portion of battery pack 100 or a subassembly thereof. One of ordinary skill in the art will appreciate that there are various areas in and on a battery pack and/or subassemblies thereof that may include battery management component 136. In one or more embodiments, battery management component 136 may be disposed directly over, adjacent to, facing, and/or near a battery module and specifically at least a portion of a battery cell, the arrangement of which will be disclosed with greater detail in reference to FIG. 3.

Still referring to FIG. 1, battery management component 136 includes a module monitor unit (MMU) 124, a pack monitoring unit (PMU) 128, and a high voltage disconnect 132. In one or more embodiments, battery management component 136 may also include a sensor 116. For example, and without limitation, battery management component 136 may include a sensor suite 200 (shown in FIG. 2) having a plurality of sensors. In one or more embodiments, battery management component 136 includes MMU 124, which is mechanically connected and communicatively connected to battery module 104. As used herein, "communicatively connected" is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit. In one or more embodiments, MMU 124 is configured to detect a condition parameter of battery module 104 of battery pack 100. For the purposes of this disclosure, a "condition parameter" is detected electrical or physical input and/or phenomenon related to a state of a battery pack. A state of a battery pack may include detectable information related to, for example, a temperature, a moisture level, a humidity, a voltage, a current, vent gas, vibrations, chemical content, or other measurable characteristics of battery pack 100 or components thereof, such as battery module 104 and/or battery cell 304. For example, and without limitation, MMU 124 may detect and/or measure a condition parameter, such as a temperature, of battery module 104. In one or more embodiments, a condition state of battery pack 100 may include a condition state of a battery module 104 and/or battery cell 304. In one or more embodiments, MMU 124 may include a sensor, which may be configured to detect and/or measure condition parameter. As used in this disclosure, a "sensor" is a device that is configured to detect an input and/or a phenomenon and transmit information and/or datum related to the detection. A sensor may generate a sensor output signal, which transmits information and/or datum related to a sensor detection. A sensor output signal may include any signal form described in this disclosure, for example digital, analog, optical, electrical, fluidic, and the like. In some cases, a sensor, a circuit, and/or a controller may perform one or more signal processing steps on a signal. For instance, a sensor, circuit, and/or controller may analyze, modify, and/or synthesize a signal in order to improve the signal, for instance by improving transmission, storage efficiency, or signal to noise ratio. Additional disclosure related to a pack monitoring system can be found in U.S. patent application Ser. No. 17/529,447 entitled "A MODULE MONITOR UNIT FOR AN ELECTRIC AIRCRAFT BATTERY PACK AND METHODS OF USE", entirety of which in incorporated herein by reference.

In one or more embodiments, MMU 124 is configured to transmit a measurement datum of battery module 104. MMU 124 may generate an output signal that includes a sensor output signal, such as a measurement datum, that includes information regarding detected condition parameter. For the purposes of this disclosure, "measurement datum" is an electronic signal representing information and/or datum of a detected electrical or physical characteristic and/or phenomenon correlated with a condition state of a battery pack. For example, measurement datum may include data of a condition parameter regarding a detected temperature of a battery cell. In one or more embodiments, measurement datum may be transmitted by MMU 124 to PMU 128 so that PMU 128 may receive measurement datum, as discussed further in this disclosure. For example, MMU 124 may transmit measurement data to a controller 140 of PMU 128.

In one or more embodiments, MMU 124 may include a plurality of MMUs. For instance, and without limitation, each battery module 104a-n may include one or more MMUs 124. For example, and without limitation, each battery module 104a-n may include two MMUs 124a,b. MMUs 124a,b may be positioned on opposing sides of battery module 104. Battery module 104 may include a plurality of MMUs to create redundancy so that, if one MMU fails or malfunctions, another MMU may still operate properly and continue to monitor corresponding battery module 104. In one or more non-limiting exemplary embodiments, MMU 124 may include mature technology so that there is a low risk. Furthermore, MMU 124 may not include software to, for example, increase reliability and durability of MMU 124 and thus, avoid complications often inherent with using software applications. MMU 124 is configured to monitor and balance all battery cell groups of battery pack 100 during charging of battery pack 100. For instance, and without limitation, MMU 124 may monitor a temperature of battery module 104 and/or a battery cell of battery module 104. For example, and without limitation, MMU 124 may monitor a battery cell group temperature. In another example, and without limitation, MMU 124 may monitor a terminal temperature of battery module 104 to, for example, detect a poor high voltage (HV) electrical connection. In one or more embodiments, an MMU 124 may be indirectly connected to PMU 128. In other embodiments, MMU 124 may be directly connected to PMU 128. In one or more embodiments, MMU 124 may be communicatively connected to an adjacent MMU 124.

Still referring to FIG. 1, battery management component 136 includes PMU 128, which is communicatively connected to MMU 124. In one or more embodiments, PMU 128 includes controller 140, which is configured to receive measurement datum from MMU 124. For example, PMU 128a may receive a plurality of measurement data associated with various states of a battery module 104 from MMU 124a. Similarly, PMU 128b may receive a plurality of measurement data from MMU 124b. In one or more embodiments, PMU 128 may receive measurement datum from MMU 124 via communication component, such as via communicative connections. For example, PMU 128 may receive measurement datum from MMU 124 via an isoSPI transceiver. In one or more embodiments, controller 140 of PMU 128 is configured to identify an operating condition of battery module 104 as a function of measurement datum. For the purposes of this disclosure, an "operating condition" is a state and/or working order of battery pack 100 and/or any components thereof. For example, and without limitation, an operating condition may include a state of charge (SOC), a depth of discharge (DOD), a temperature reading, a moisture/humidity level, a gas level, a chemical level, or the like. In one or more embodiments, controller 140 of PMU 128 is configured to determine a critical event element if operating condition is outside of a predetermined threshold (also referred to herein as a "threshold"). For the purposes of this disclosure, a "critical event element" is a failure and/or critical operating condition of a battery pack and/or components thereof that may be harmful to a battery pack and/or corresponding electric aircraft. For instance, and without limitation, if an identified operating condition, such as a temperature of a battery cell 304 of battery pack 100, does not fall within a predetermined threshold, such as a range of acceptable, operational temperatures of a battery cell, then a critical event element is determined by controller 140 of PMU 128. For example, and without limitation, PMU 128 may use measurement datum from MMU 124 to identify a temperature of 95° F. for a battery cell. If the predetermined temperature threshold is, for example, 75 to 90° F., then the determined operating condition is outside of the predetermined temperature threshold, such as exceeding the upper threshold of 90° F., and a critical event element is determined by controller 140. As used in this disclosure, a "predetermined threshold" is a limit and/or range of an acceptable quantitative value or representation related to a normal operating condition and/or state of a battery pack and/or components thereof. In one or more embodiments, an operating condition outside of a threshold is a critical operating condition, which triggers a critical event element. An operating condition within the threshold is a normal operating condition, which indicates that a battery pack is working properly and no critical event element is determined. For example, and without limitation, if an operating condition of temperature exceeds a predetermined temperature threshold of a battery pack, then the battery pack is considered to be operating at a critical operating condition and may be at risk of overheating and experiencing a catastrophic failure. In one or more embodiments, critical event elements may include high shock/drop, overtemperature, undervoltage, high moisture, contactor welding, and the like. Additional disclosure related to a pack monitoring system can be found in U.S. patent application Ser. No. 17/529,583 entitled "A PACK MONITORING UNIT FOR AN ELECTRIC AIRCRAFT BATTERY PACK AND METHODS OF USE FOR BATTERY MANAGEMENT", entirety of which in incorporated herein by reference.

In one or more embodiments, controller 140 of PMU 128 is configured to generate an action command if critical event element is determined by controller 140. For the purposes of this disclosure, an "action command" is a control signal generated by a controller that provides instructions related to reparative action needed to prevent and/or reduce damage to a battery back, components thereof, and/or aircraft as a result of a critical operating condition of the battery pack. Continuing the previously described example above, if an identified operating condition includes a temperature of 95° F., which exceeds a predetermined temperature threshold, then controller 140 may determine a critical event element indicating that battery pack 100 is working at a critical temperature level and at risk of catastrophic failure.

In one or more embodiments, controller 140 may include a computing device (as discussed in FIG. 8), a central processing unit (CPU), a microprocessor, a digital signal processor (DSP), an application specific integrated circuit (ASIC), a control circuit, a combination thereof, or the like. In one or more embodiments, output signals from various components of battery pack 100 may be analog or digital. Controller 140 may convert output signals from MMU 124 and/or sensor 116 to a usable form by the destination of those signals. For example, and without limitation, PMU 128 may include a switching regulator 424 that converts power received from battery module 104 of battery pack 100 (shown in FIG. 4). The usable form of output signals from MMUs and/or sensors, through processor may be either digital, analog, a combination thereof, or an otherwise unstated form. Processing may be configured to trim, offset, or otherwise compensate the outputs of sensor. Based on MMU and/or sensor output, controller 140 may determine the output to send to a downstream component. Controller 140 may include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components. In one or more embodiments, PMU 128 may run state estimation algorithms.

Still referring to FIG. 1, battery management component 136 includes a high voltage disconnect 132 communicatively connected to battery module 104, wherein high voltage disconnect 132 is configured to terminate power supply connection 112 between battery module 104 and electric aircraft 108 in response to receiving an action command from PMU 128. PMU 128 may be configured to determine a critical event element, such as high shock/drop, overtemperature, undervoltage, contactor welding, and the like. High voltage disconnect 132 is configured to receive action command generated by PMU 128 and thus lock out battery pack 100 for maintenance in response to received action command. In one or more embodiments, PMU 128 may create an alert, such as a lockout flag, which may be saved across reboots. A "lockout flag" may include an indicator alerting a user of a critical event element and subsequent termination of power supply connection 112 by high voltage disconnect 132. In one or more embodiments, a lockout flag may be saved in memory component 144 of PMU 128 so that, despite rebooting battery pack 100 or complete loss of power of battery pack 100, power supply connection remains terminated and an alert regarding the termination remains. In one or more embodiments, an alert and/or lockout flag may be transmitted to a user device for viewing. For example, and without limitation, an alert may be shown on a mobile device, a laptop, a tablet, a display of an electric aircraft user interface, or the like. In one or more embodiments, lockout flag cannot be removed until a critical event element is no longer determined by controller 140. For, example, PMU 128 may be continuously updating an operating condition and determining if operating condition is outside of a predetermined threshold. In one or more embodiments, lockout flag may include an alert on a graphic user interface of, for example, a remote computing device, such as a mobile device, tablet, laptop, desktop and the like. In other embodiments, lockout flag may be indicated to a user via an illuminated LED that is remote or locally located on battery pack 100. In one or more embodiments, PMU 128 may include control of cell group balancing via MMUs, control of contactors (high voltage connections, etc.) control of welding detection, control of pyro fuses, and the like.

In one or more embodiments, battery management component 136 may include a plurality of PMUs 128. For instance, and without limitation, battery management component 136 may include a pair of PMUs. For example, and without limitation, battery management component 136 may include a first PMU 128a and a second PMU 128b, which are each disposed in or on battery pack 100 and may be physically isolated from each other. "Physical isolation", for the purposes of this disclosure, refer to a first system's components, communicative connection, and any other constituent parts, whether software or hardware, are separated from a second system's components, communicative coupling, and any other constituent parts, whether software or hardware, respectively. Continuing in reference to the non-limiting exemplary embodiment, first PMU 128a and second PMU 128b may perform the same or different functions. For example, and without limitation, first and second PMUs 128a,b may perform the same, and therefore, redundant functions. Thus, if one PMU 128a/b fails or malfunctions, in whole or in part, the other PMU 128b/a may still be operating properly and therefore battery management component 136 may still operate and function properly to manage battery pack 100. One of ordinary skill in the art would understand that the terms "first" and "second" do not refer to either PMU as primary or secondary. In non-limiting embodiments, the first and second PMUs 128a,b, due to their physical isolation, may be configured to withstand malfunctions or failures in the other system and survive and operate. Provisions may be made to shield first PMU 128a from second PMU 128b other than physical location, such as structures and circuit fuses. In non-limiting embodiments, first PMU 128a, second PMU 128b, or subcomponents thereof may be disposed on an internal component or set of components within battery pack 100, such as on a battery module sense board, as discussed further below in this disclosure.

Still referring to FIG. 1, first PMU 128a may be electrically isolated from second PMU 128b. "Electrical isolation", for the purposes of this disclosure, refer to a first system's separation of components carrying electrical signals or electrical energy from a second system's components. First PMU 128a may suffer an electrical catastrophe, rendering it inoperable, and due to electrical isolation, second PMU 128b may still continue to operate and function normally, allowing for continued management of battery pack 100 of electric aircraft 108. Shielding such as structural components, material selection, a combination thereof, or another undisclosed method of electrical isolation and insulation may be used, in non-limiting embodiments. For example, and without limitation, a rubber or other electrically insulating material component may be disposed between electrical components of first and second PMUs 128a, b, preventing electrical energy to be conducted through it, isolating the first and second PMUs 128a,b form each other. Similarly, MMUs 124 may be physically and/or electrically isolated relative to each other and/or PMUs in case of failure of an MMU and/or PMU.

With continued reference to FIG. 1, battery management component 136 may include a memory component 144. In one or more embodiments, memory component 144 may be configured to store datum related to battery pack 100, such as data related to battery modules 104a-n. For example, and without limitation, memory component 144 may store sensor datum, measurement datum, operation condition, critical event element, lockout flag, and the like. Memory component 144 may include a database. Memory component 144 may include a solid-state memory or tape hard drive. Memory component 144 may be communicatively connected to PMU 128 and may be configured to receive electrical signals related to physical or electrical phenomenon measured and store those electrical signals as battery module data. Alternatively, memory component 144 may be a plurality of discrete memory components that are physically and electrically isolated from each other. One of ordinary skill in the art would understand the virtually limitless arrangements of data stores with which battery pack 100 could employ to store battery pack data.

Figure 2:
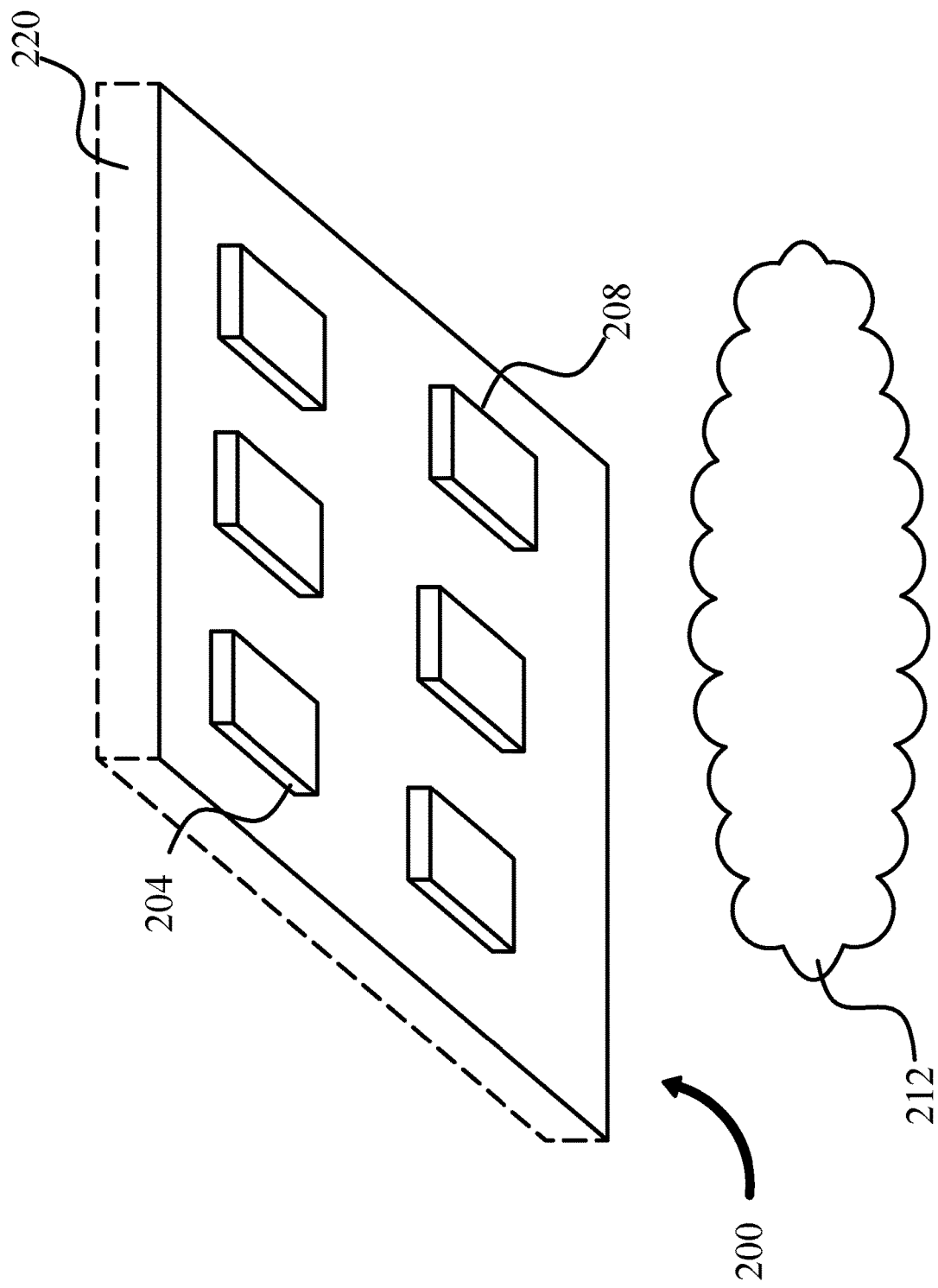
FIG. 2 is an illustration of an exemplary embodiment of a sensor suite in partial cut-off view in one or more aspects of the present disclosure.

Referring now to FIG. 2, an embodiment of sensor suite 200 is presented. The herein disclosed system and method may comprise a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery pack 100 measuring temperature, electrical characteristic such as voltage, amperage, resistance, or impedance, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of battery management system 100 and/or user to detect phenomenon is maintained and in a non-limiting example, a user alter aircraft usage pursuant to sensor readings.

Sensor suite 200 may be suitable for use as sensor 116 as disclosed with reference to FIG. 1 hereinabove. Sensor suite 200 includes a moisture sensor 204. "Moisture", as used in this disclosure, is the presence of water, this may include vaporized water in air, condensation on the surfaces of objects, or concentrations of liquid water. Moisture may include humidity. "Humidity", as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity", for the purposes of this disclosure, is expressed as a percentage, indicating a present stat of absolute humidity relative to a maximum humidity given the same temperature. "Specific humidity", for the purposes of this disclosure, is the ratio of water vapor mass to total moist air parcel mass, where parcel is a given portion of a gaseous medium. Moisture sensor 204 may be psychrometer. Moisture sensor 204 may be a hygrometer. Moisture sensor 204 may be configured to act as or include a humidistat. A "humidistat", for the purposes of this disclosure, is a humidity-triggered switch, often used to control another electronic device. Moisture sensor 204 may use capacitance to measure relative humidity and include in itself, or as an external component, include a device to convert relative humidity measurements to absolute humidity measurements. "Capacitance", for the purposes of this disclosure, is the ability of a system to store an electric charge, in this case the system is a parcel of air which may be near, adjacent to, or above a battery cell.

With continued reference to FIG. 2, sensor suite 200 may include electrical sensors 208. Electrical sensors 208 may be configured to measure voltage across a component, electrical current through a component, and resistance of a component. Electrical sensors 208 may include separate sensors to measure each of the previously disclosed electrical characteristics such as voltmeter, ammeter, and ohmmeter, respectively.

Alternatively or additionally, and with continued reference to FIG. 2, sensor suite 200 include a sensor or plurality thereof that may detect voltage and direct the charging of individual battery cells according to charge level; detection may be performed using any suitable component, set of components, and/or mechanism for direct or indirect measurement and/or detection of voltage levels, including without limitation comparators, analog to digital converters, any form of voltmeter, or the like. Sensor suite 200 and/or a control circuit incorporated therein and/or communicatively connected thereto may be configured to adjust charge to one or more battery cells as a function of a charge level and/or a detected parameter. For instance, and without limitation, sensor suite 200 may be configured to determine that a charge level of a battery cell is high based on a detected voltage level of that battery cell or portion of the battery pack. Sensor suite 200 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensor suite 200 may include digital sensors, analog sensors, or a combination thereof. Sensor suite 200 may include digital-to-analog converters (DAC), analog-to-digital converters (ADC, A/D, A-to-D), a combination thereof, or other signal conditioning components used in transmission of a first plurality of battery pack data to a destination over wireless or wired connection.

With continued reference to FIG. 2, sensor suite 200 may include thermocouples, thermistors, thermometers, passive infrared sensors, resistance temperature sensors (RTDs), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite 200, may be measured in Fahrenheit (° F.), Celsius (° C.), Kelvin (° K), or another scale alone or in combination. The temperature measured by sensors may comprise electrical signals which are transmitted to their appropriate destination wireless or through a wired connection.

With continued reference to FIG. 2, sensor suite 200 may include a sensor configured to detect gas that may be emitted during or after a cell failure. "Cell failure", for the purposes of this disclosure, refers to a malfunction of a battery cell, which may be an electrochemical cell, that renders the cell inoperable for its designed function, namely providing electrical energy to at least a portion of an electric aircraft. Byproducts 212 of cell failure may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 200, may be configured to detect combustible, flammable, toxic, oxygen depleted, a combination thereof, or another type of gas alone or in combination. The gas sensor that may be present in sensor suite 200 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 200 may include sensors that are configured to detect non-gaseous byproducts 212 of cell failure including, in non-limiting examples, liquid chemical leaks including aqueous alkaline solution, ionomer, molten phosphoric acid, liquid electrolytes with redox shuttle and ionomer, and salt water, among others. Sensor suite 200 may include sensors that are configured to detect non-gaseous byproducts 212 of cell failure including, in non-limiting examples, electrical anomalies as detected by any of the previous disclosed sensors or components.

With continued reference to FIG. 2, sensor suite 200 may be configured to detect events where voltage nears an upper voltage threshold or lower voltage threshold. The upper voltage threshold may be stored in memory component 144 for comparison with an instant measurement taken by any combination of sensors present within sensor suite 200. The upper voltage threshold may be calculated and calibrated based on factors relating to battery cell health, maintenance history, location within battery pack, designed application, and type, among others. Sensor suite 200 may measure voltage at an instant, over a period of time, or periodically. Sensor suite 200 may be configured to operate at any of these detection modes, switch between modes, or simultaneous measure in more than one mode. In one or more exemplary embodiments, PMU 128 may determine, using sensor suite 200, a critical event element where voltage nears the lower voltage threshold. The lower voltage threshold may indicate power loss to or from an individual battery cell or portion of the battery pack. PMU 128 may determine through sensor suite 200 critical event elements where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

In one or more embodiments, sensor suite 200 may include an inertial measurement unit (IMU). In one or more embodiments, an IMU may be configured to detect a change in specific force of a body. An IMU may include an accelerometer, a gyro sensor, a magnetometer, an E-compass, a G-sensor, a geomagnetic sensor, and the like. An IMU may be configured to obtain measurement datum. PMU 128 may determine a critical event element by if, for example, an accelerometer of sensor suite 200 detects a force experienced by battery pack 100 that exceeds a predetermined threshold.

With reference to FIG. 3, an exemplary embodiment of an MMU 124 is shown in accordance with one or more embodiments of the present disclosure. MMU 124 may monitor battery cells 304. As previously mentioned, MMU 124 may include one or more sensors. For example, MMU 124 may include a thermistor 312 to detect a temperature of a corresponding battery module 104. MMU 124 may also monitor a charging status of each battery cell 304. For example, MMU 124 may detect if one cell as more power than another cell of battery module 104 during recharging.

As previously mentioned, battery module 104 may include a plurality of MMUs 124. For example, battery module 104 may include a left and a right MMU on opposing sides of battery module 104 to create redundancy, as previously discussed in this disclosure. In one or more embodiments, each MMU 124 may communicate with another MMU 124 via a communication component, such as a communicative connection. For example, an MMU 124 may communicate with an adjacent MMU 124 using an isoSPI transceiver 308. In one or more embodiments, each MMU 124 may use a wireless and/or wired connection to communicated with each other.

In one or more embodiments, MMU 124 may include one or more circuits and/or circuit elements, including and without limitation, a printed circuit board component, aligned with a first side of battery module 104 and the openings correlating to battery cells 304. In one or more embodiments, MMU 124 may include, without limitation, a control circuit configured to perform and/or direct any actions performed by MMU 124 and/or any other component and/or element described in this disclosure; control circuit may include any analog or digital control circuit, including without limitation a combinational and/or synchronous logic circuit, a processor, microprocessor, microcontroller, or the like.

Still referring to FIG. 3, MMU 124 may include sensor 116 or sensor suite 200 configured to measure physical and/or electrical parameters, such as without limitation temperature, voltage, orientation, or the like, of one or more battery cells 304. MMU 124 and/or a control circuit incorporated therein and/or communicatively connected thereto, may further be configured to detect a measurement datum of each battery cell 304, which controller 140 of PMU 128 may ultimately use to determine a failure within each battery cell 304, such as critical event element. Cell failure may be characterized by a spike in temperature and MMU 124 may be configured to detect that increase, which in turn, PMU 128 uses to determine a critical event element and generate signals, to disconnect power supply connection 112 and to notify users, support personnel, safety personnel, maintainers, operators, emergency personnel, aircraft computers, or a combination thereof. In one or more embodiments, measurement data of MMU may be stored in memory component 144.

Figure 4:
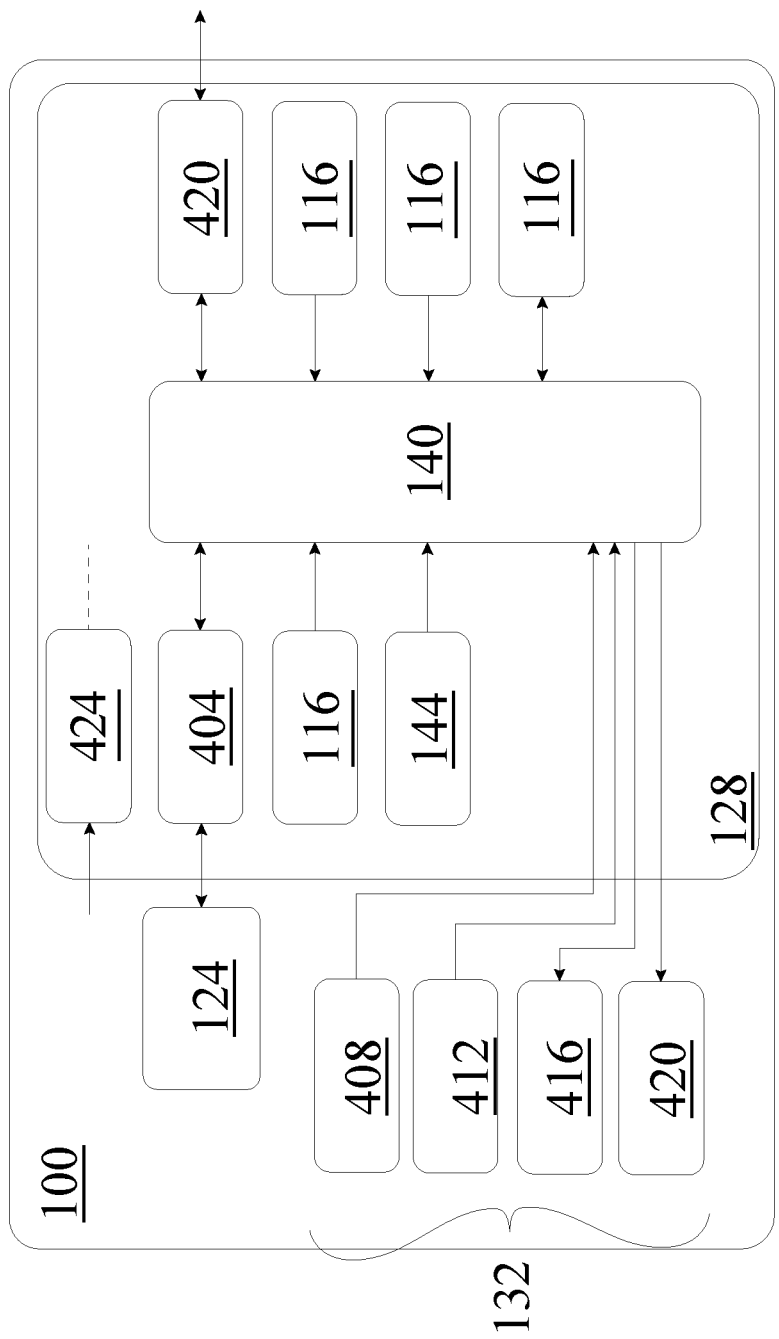
FIG. 4 is a block diagram of another exemplary embodiment a pack monitor unit in one or more aspect of the present disclosure.

With reference to FIG. 4, an exemplary embodiment of a PMU 128 is shown in accordance with one or more embodiments of the present disclosure. In one or more embodiments, PMU 128 may include controller 140. Controller 140 may include a computing device, a processor, a microprocessor, a control circuit, control circuit, or the like. In one or more embodiments, PMU 128 may communicate with MMU 124 via a transceiver. For example, and without limitation, using an isoSPI transceiver 404.

In one or more embodiments, PMU 128 may include sensor 116. For example, and without limitation, condition characteristics of battery module 104 may be detected by sensor 116, which may be communicatively connected to MMU 124. Sensor 116 may include a sensor suite 200 or one or more individual sensors, which may include, but are not limited to, one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, imaging sensors, force sensors, Hall sensors, airspeed sensors, throttle position sensors, and the like. Sensor 116 may be a contact or a non-contact sensor. For example, and without limitation, sensor 116 may be connected to battery module 104 and/or battery cell 304. In other embodiments, sensor 116 may be remote to battery module and/or battery cell 304. Sensor 116 may be communicatively connected to controller 140 of PMU 128 so that sensor 116 may transmit/receive signals to/from controller 140, respectively. Signals, such as signals of sensor 116 and controller 140, may include electrical, electromagnetic, visual, audio, radio waves, or another undisclosed signal type alone or in combination. In one or more embodiments, communicatively connecting is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit.

Referring again to FIG. 4, PMU 128 may include memory component 144, as previously mentioned in this disclosure. In one or more embodiments, memory component 144 may store battery pack data. Battery pack data may include be generated data, detected data, measured data, inputted data, and the like. For example, measurement datum may be stored in memory component 144. In another example, critical event element and/or corresponding lockout flag may be stored in memory component 144. Battery pack data may also include inputted datum, which may include total flight hours that battery pack 100 and/or electric aircraft 108 have been operating, flight plan of electric aircraft, battery pack identification, battery pack verification, a battery pack maintenance history, battery pack specifications, or the like. In one or more embodiments, battery pack maintenance history may include mechanical failures and technician resolutions thereof, electrical failures and technician resolutions thereof. Additionally, battery pack maintenance history may include component failures such that the overall battery pack still functions. In one or more embodiments, memory component 144 may be communicatively connected to sensors, such as sensor 116, that detect, measure, and obtain a plurality of measurements, which may include current, voltage, resistance, impedance, coulombs, watts, temperature, moisture/ humidity, or a combination thereof. Additionally, or alternatively, memory component 144 may be communicatively connected to a sensor suite consistent with this disclosure to measure physical and/or electrical characteristics. In one or more embodiments, memory component 144 may store battery pack data that includes an upper threshold and a lower threshold of a state and/or condition consistent with this disclosure. In one or more exemplary embodiments, battery pack data may include a moisture-level threshold. The moisture-level threshold may include an absolute, relative, and/or specific moisture-level threshold. In other exemplary embodiments, battery pack data may include a temperature threshold. In other exemplary embodiments, battery pack data may include a high-shock threshold.

In one or more embodiments, memory component 144 may be configured to save measurement datum, operating condition, critical event element, and the like periodically in regular intervals to memory component 144. "Regular intervals", for the purposes of this disclosure, refers to an event taking place repeatedly after a certain amount of elapsed time. In one or more embodiments, PMU 128 may include a timer that works in conjunction to determine regular intervals. In other embodiments, PMU may continuously update operating condition or critical event element and, thus, continuously store data related the information in memory component. A Timer may include a timing circuit, internal clock, or other circuit, component, or part configured to keep track of elapsed time and/or time of day. For example, in non-limiting embodiments, memory component 144 may save the first and second battery pack data every 30 seconds, every minute, every 30 minutes, or another time period according to timer. Additionally or alternatively, memory component 144 may save battery pack data after certain events occur, for example, in non-limiting embodiments, each power cycle, landing of the electric aircraft, when battery pack is charging or discharging, a failure of battery module, a malfunction of battery module, a critical event element, or scheduled maintenance periods. In non-limiting embodiments, battery pack 100 phenomena may be continuously measured and stored at an intermediary storage location, and then permanently saved by memory component 144 at a later time, like at a regular interval or after an event has taken place as disclosed hereinabove. Additionally or alternatively, data storage system may be configured to save battery pack data at a predetermined time. "Predetermined time", for the purposes of this disclosure, refers to an internal clock within battery pack commanding memory component 144 to save battery pack data at that time.

In one or more embodiments, high voltage disconnect may include a bus. A "bus", for the purposes of this disclosure and in electrical parlance is any common connection to which any number of loads, which may be connected in parallel, and share a relatively similar voltage may be electrically coupled. Bus may be responsible for conveying electrical energy stored in battery pack 100 to at least a portion of an electric aircraft, as discussed previously in this disclosure. High voltage disconnect 132 may include a ground fault detection 408, a high voltage current sense 412, a high voltage pyro fuse 416, a high voltage contactor 420, and the like. High voltage disconnect 132 may physically and/or electrically breaks power supply communication between electric aircraft 108 and battery module 104 of battery pack 100. In one or more embodiments, in one or more embodiments, the termination of power supply connection 112 may be restored by high voltage disconnect 132 once PMU 128 no longer determine a critical event element.

In other embodiments, power supply connection 112 may be restored manually, such as by a user.

In one or more embodiments, controller 140 may conduct reparative procedures after determining critical even element to reduce or eliminate critical element event. For example, and without limitation, controller 140 may initiate reparative procedure of a circulation of a coolant through a cooling system of battery pack 100 to lower a temperature of a battery module if the determined temperature of the battery module exceeds a predetermined temperature threshold. In another example, and without limitation, if a fluid accumulation level is detected that is then determined to exceed a predetermined byproduct threshold, then high voltage disconnect 132 may terminate power supply connection 112. According to some embodiments, a vent of battery pack 100 may be opened to circulate air through battery pack 100 and reduce detected gas levels. Additionally, vent of battery module 104 may have a vacuum applied to aid in venting of a byproduct, such as ejecta. Vacuum pressure differential may range from 0.1"Hg to 36"Hg.

Figure 5A:
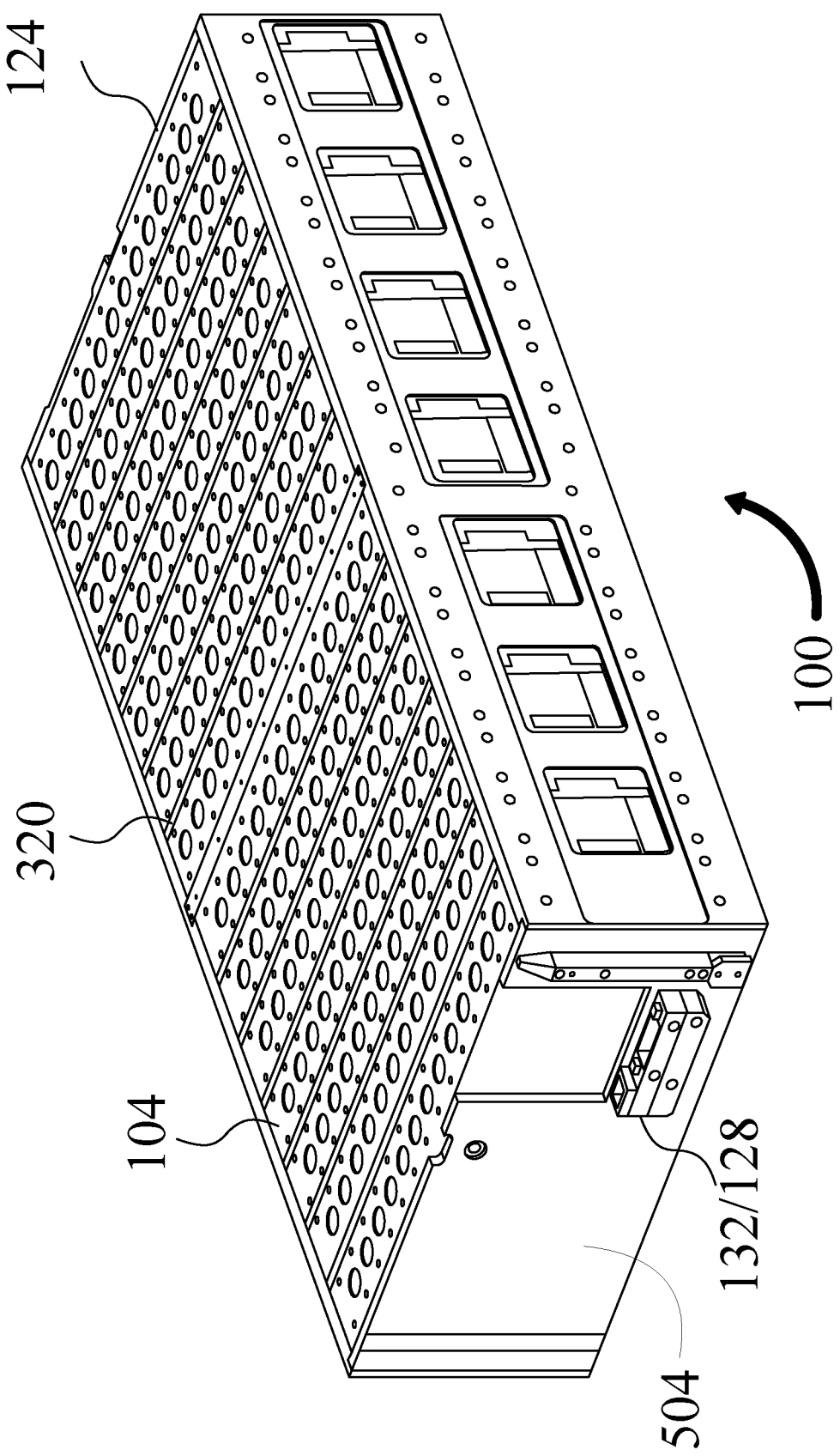
FIGS. 5A and 5B are illustrations of exemplary embodiments of battery pack configured for use in an electric aircraft in isometric view in accordance with one or more aspects of the present disclosure.
Figure 5B:
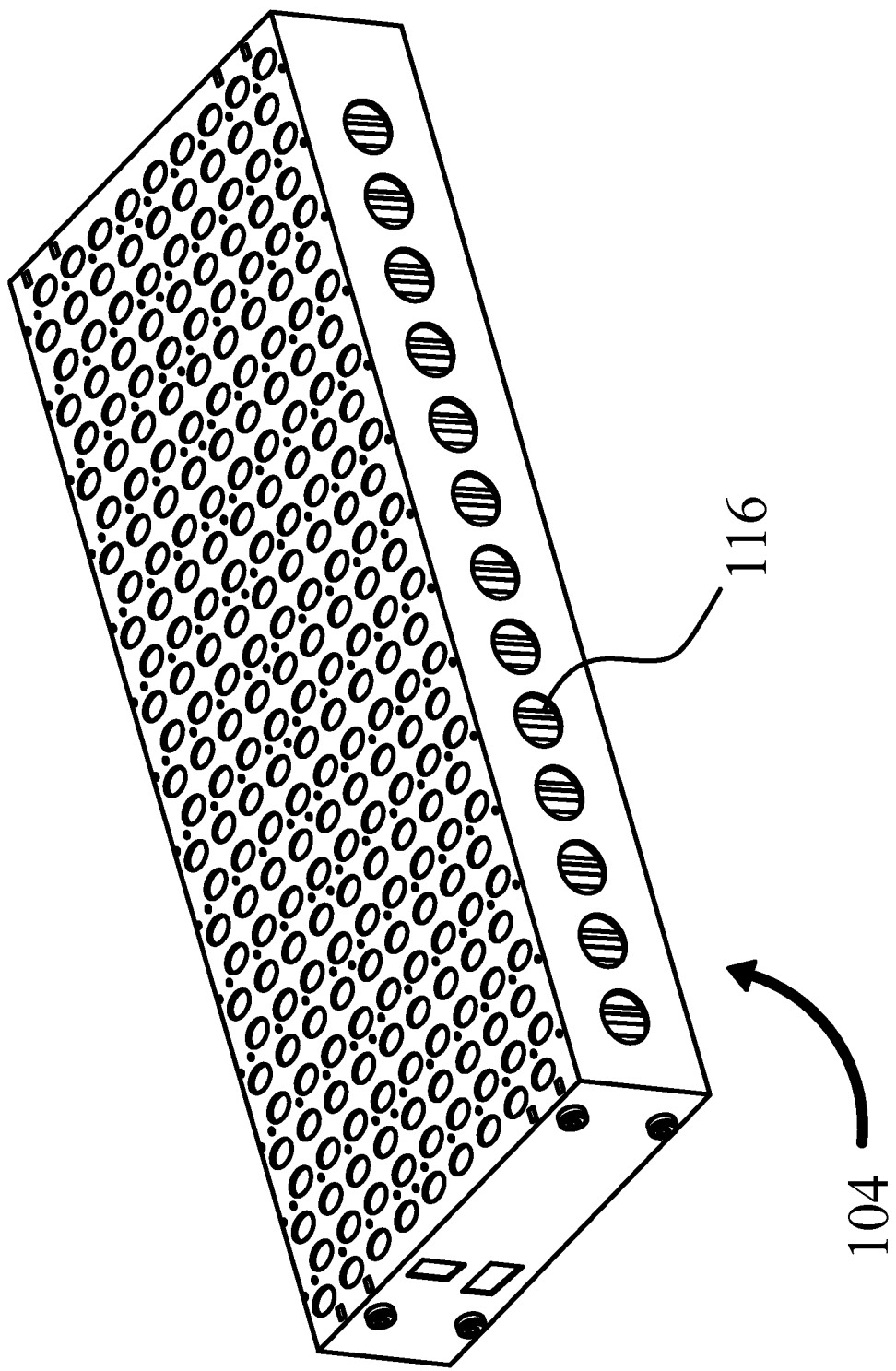

Now referring to FIGS. 5A and 5B, an exemplary embodiment of an eVTOL aircraft battery pack is illustrated. Battery pack 100 is a power source that may be configured to store electrical energy in the form of a plurality of battery modules, which themselves include of a plurality of electrochemical cells. These cells may utilize electrochemical cells, galvanic cells, electrolytic cells, fuel cells, flow cells, pouch cells, and/or voltaic cells. In general, an electrochemical cell is a device capable of generating electrical energy from chemical reactions or using electrical energy to cause chemical reactions, this disclosure will focus on the former. Voltaic or galvanic cells are electrochemical cells that generate electric current from chemical reactions, while electrolytic cells generate chemical reactions via electrolysis. In general, the term "battery" is used as a collection of cells connected in series or parallel to each other. A battery cell may, when used in conjunction with other cells, may be electrically connected in series, in parallel or a combination of series and parallel. Series connection includes wiring a first terminal of a first cell to a second terminal of a second cell and further configured to include a single conductive path for electricity to flow while maintaining the same current (measured in Amperes) through any component in the circuit. A battery cell may use the term "wired", but one of ordinary skill in the art would appreciate that this term is synonymous with "electrically connected", and that there are many ways to couple electrical elements like battery cells together. An example of a connector that does not include wires may be prefabricated terminals of a first gender that mate with a second terminal with a second gender. Battery cells may be wired in parallel. Parallel connection includes wiring a first and second terminal of a first battery cell to a first and second terminal of a second battery cell and further configured to include more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high-current applications, or the like. In an exemplary embodiment, and without limitation, battery pack 100 include 196 battery cells in series and 18 battery cells in parallel. This is, as someone of ordinary skill in the art would appreciate, is only an example and battery pack 100 may be configured to have a near limitless arrangement of battery cell configurations. Battery pack 100 may be designed to the Federal Aviation Administration (FAA)'s Design Assurance Level A (DAL-A), using redundant DAL-B subsystems.

With continued reference to FIGS. 5A and 5B, battery pack 100 may include a plurality of battery modules 104. Battery modules 104 may be wired together in series and in parallel. Battery pack 100 may include a center sheet which may include a thin barrier. The barrier may include a fuse connecting battery modules on either side of the center sheet. The fuse may be disposed in or on the center sheet and configured to connect to an electric circuit comprising a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. The fuse may include a thermal fuse, mechanical fuse, blade fuse, expulsion fuse, spark gap surge arrestor, varistor, or a combination thereof.

Battery pack 100 may also include a side wall includes a laminate of a plurality of layers configured to thermally insulate the plurality of battery modules from external components of battery pack 100. The side wall layers may include materials which possess characteristics suitable for thermal insulation as described in the entirety of this disclosure like fiberglass, air, iron fibers, polystyrene foam, and thin plastic films, to name a few. The side wall may additionally or alternatively electrically insulate the plurality of battery modules from external components of battery pack 100 and the layers of which may include polyvinyl chloride (PVC), glass, asbestos, rigid laminate, varnish, resin, paper, Teflon, rubber, and mechanical lamina. The center sheet may be mechanically coupled to the side wall in any manner described in the entirety of this disclosure or otherwise undisclosed methods, alone or in combination. The side wall may include a feature for alignment and coupling to the center sheet. This feature may include a cutout, slots, holes, bosses, ridges, channels, and/or other undisclosed mechanical features, alone or in combination.

With continued reference to FIGS. 5A and 5B, battery pack 100 may also include an end panel 504 including a plurality of electrical connectors and further configured to fix battery pack 100 in alignment with at least the side wall. End panel 504 may include a plurality of electrical connectors of a first gender configured to electrically and mechanically connect to electrical connectors of a second gender. The end panel may be configured to convey electrical energy from battery cells to at least a portion of an eVTOL aircraft, for example, using high voltage disconnect 132. Electrical energy may be configured to power at least a portion of an eVTOL aircraft or include signals to notify aircraft computers, personnel, users, pilots, and any others of information regarding battery health, emergencies, and/or electrical characteristics. The plurality of electrical connectors may include blind mate connectors, plug and socket connectors, screw terminals, ring and spade connectors, blade connectors, and/or an undisclosed type alone or in combination. The electrical connectors of which the end panel includes may be configured for power and communication purposes. A first end of the end panel may be configured to mechanically couple to a first end of a first side wall by a snap attachment mechanism, similar to end cap and side panel configuration utilized in the battery module. To reiterate, a protrusion disposed in or on the end panel may be captured, at least in part, by a receptacle disposed in or on the side wall. A second end of end the panel may be mechanically coupled to a second end of a second side wall in a similar or the same mechanism.

With continued reference to FIGS. 5A and 5B, sensor suite 200 may be disposed in or on a portion of battery pack 100 near battery modules or battery cells. In one or more embodiments, PMU 128 may be configured to communicate with an electric aircraft, such as a flight controller of electric aircraft 108, using a controller area network (CAN), such as by using a CAN transceiver 424 as shown in FIG. 4. In one or more embodiments, a controller area network may include a bus. Bus may include an electrical bus. Bus may refer to power busses, audio busses, video busses, computing address busses, and/or data busses. Bus may be additionally or alternatively responsible for conveying electrical signals generated by any number of components within battery pack 100 to any destination on or offboard an electric aircraft. Battery management component 136 may include wiring or conductive surfaces only in portions required to electrically couple bus to electrical power or necessary circuits to convey that power or signals to their destinations.

Outputs from sensors or any other component present within system may be analog or digital. Onboard or remotely located processors can convert those output signals from sensor suite to a usable form by the destination of those signals. The usable form of output signals from sensors, through processor may be either digital, analog, a combination thereof or an otherwise unstated form. Processing may be configured to trim, offset, or otherwise compensate the outputs of sensor suite. Based on sensor output, the processor can determine the output to send to downstream component. Processor can include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components.

With continued reference to FIGS. 5A and 5B, any of the disclosed components or systems, namely battery pack 100, PMU 128, and/or battery cell 304 may incorporate provisions to dissipate heat energy present due to electrical resistance in integral circuit. Battery pack 100 includes one or more battery element modules wired in series and/or parallel. The presence of a voltage difference and associated amperage inevitably will increase heat energy present in and around battery pack 100 as a whole. The presence of heat energy in a power system is potentially dangerous by introducing energy possibly sufficient to damage mechanical, electrical, and/or other systems present in at least a portion of an electric aircraft. Battery pack 100 may include mechanical design elements, one of ordinary skill in the art, may thermodynamically dissipate heat energy away from battery pack 100. The mechanical design may include, but is not limited to, slots, fins, heat sinks, perforations, a combination thereof, or another undisclosed element.

Heat dissipation may include material selection beneficial to move heat energy in a suitable manner for operation of battery pack 100. Certain materials with specific atomic structures and therefore specific elemental or alloyed properties and characteristics may be selected in construction of battery pack 100 to transfer heat energy out of a vulnerable location or selected to withstand certain levels of heat energy output that may potentially damage an otherwise unprotected component. One of ordinary skill in the art, after reading the entirety of this disclosure would understand that material selection may include titanium, steel alloys, nickel, copper, nickel-copper alloys such as Monel, tantalum and tantalum alloys, tungsten and tungsten alloys such as Inconel, a combination thereof, or another undisclosed material or combination thereof. Heat dissipation may include a combination of mechanical design and material selection. The responsibility of heat dissipation may fall upon the material selection and design as disclosed above in regard to any component disclosed in this paper. The battery pack 100 may include similar or identical features and materials ascribed to battery pack 100 in order to manage the heat energy produced by these systems and components.

According to embodiments, the circuitry disposed within or on battery pack 100 may be shielded from electromagnetic interference. The battery elements and associated circuitry may be shielded by material such as mylar, aluminum, copper a combination thereof, or another suitable material. The battery pack 100 and associated circuitry may include one or more of the aforementioned materials in their inherent construction or additionally added after manufacture for the express purpose of shielding a vulnerable component. The battery pack 100 and associated circuitry may alternatively or additionally be shielded by location. Electrochemical interference shielding by location includes a design configured to separate a potentially vulnerable component from energy that may compromise the function of said component. The location of vulnerable component may be a physical uninterrupted distance away from an interfering energy source, or location configured to include a shielding element between energy source and target component. The shielding may include an aforementioned material in this section, a mechanical design configured to dissipate the interfering energy, and/or a combination thereof. The shielding comprising material, location and additional shielding elements may defend a vulnerable component from one or more types of energy at a single time and instance or include separate shielding for individual potentially interfering energies.

Figure 6:
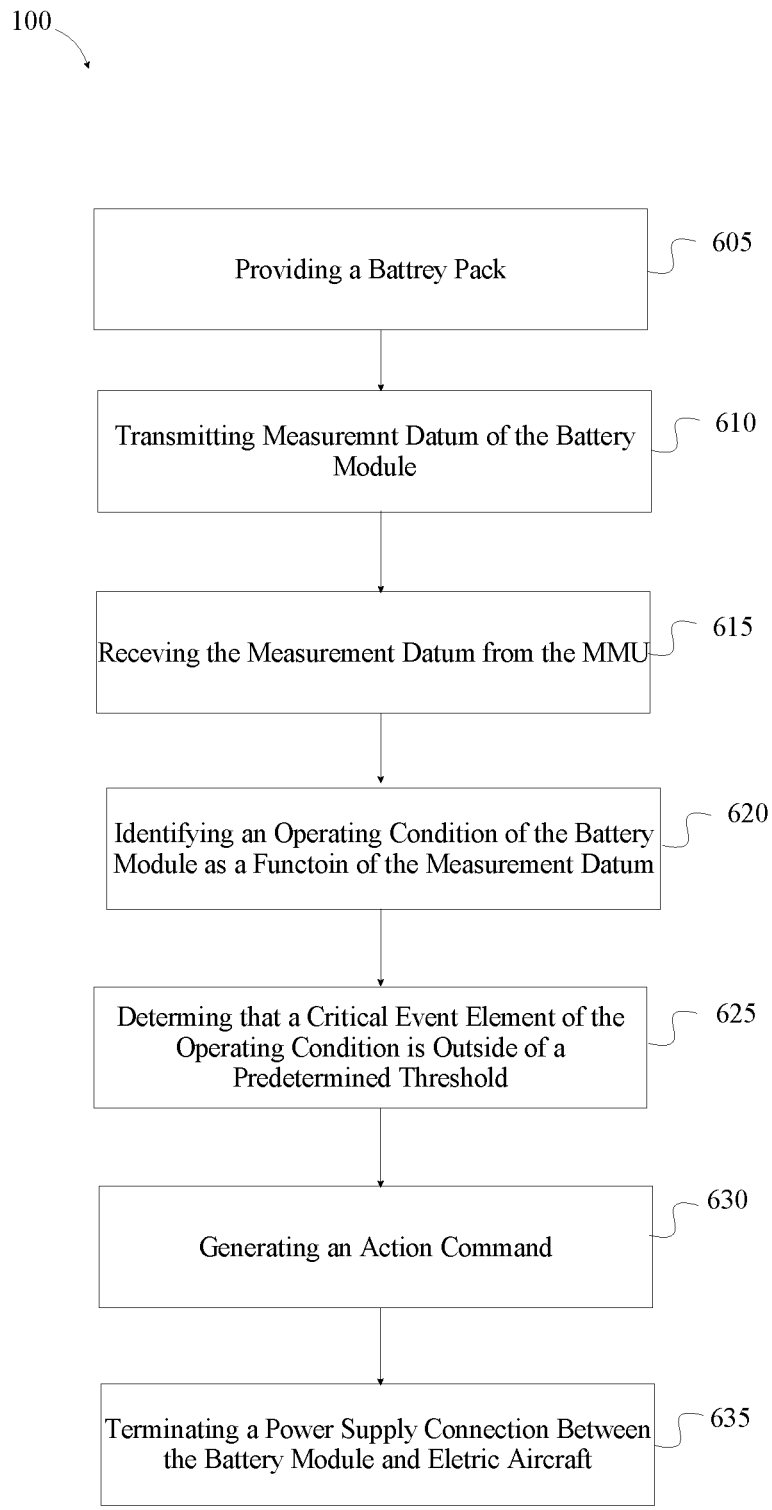
FIG. 6 is a flow chart of an exemplary embodiment of a method of battery pack management in one or more aspects of the present disclosure.

Referring now to FIG. 6, a flow chart showing an exemplary method 600 of battery pack management in accordance with one or more embodiments of the present disclosure. As shown in step 605, method 600 includes providing battery pack 100. As shown in step 610, method 600 includes transmitting, MMU 124, measurement datum of battery module 104 of battery pack 100.

As shown in step block 615, method 600 includes receiving, by controller 140 of PMU 128 communicatively connected to MMU 124, the measurement datum from MMU 124. As shown in step 620, method 600 includes identifying, by controller 140, an operating condition of battery module 104 as a function of the measurement datum. As shown in step 625, method 600 includes determining, by controller 140, a critical event element if the operating condition is outside of a predetermined threshold.

As shown in step block 630, method 600 includes generating, by controller 140, an action command if the critical event element is determined. As shown in step 635, method 600 includes terminating, by high voltage disconnect 132, power supply connection 112 between battery module 104 and electric aircraft 108 in response to receiving the action command from PMU 128.

Figure 7:
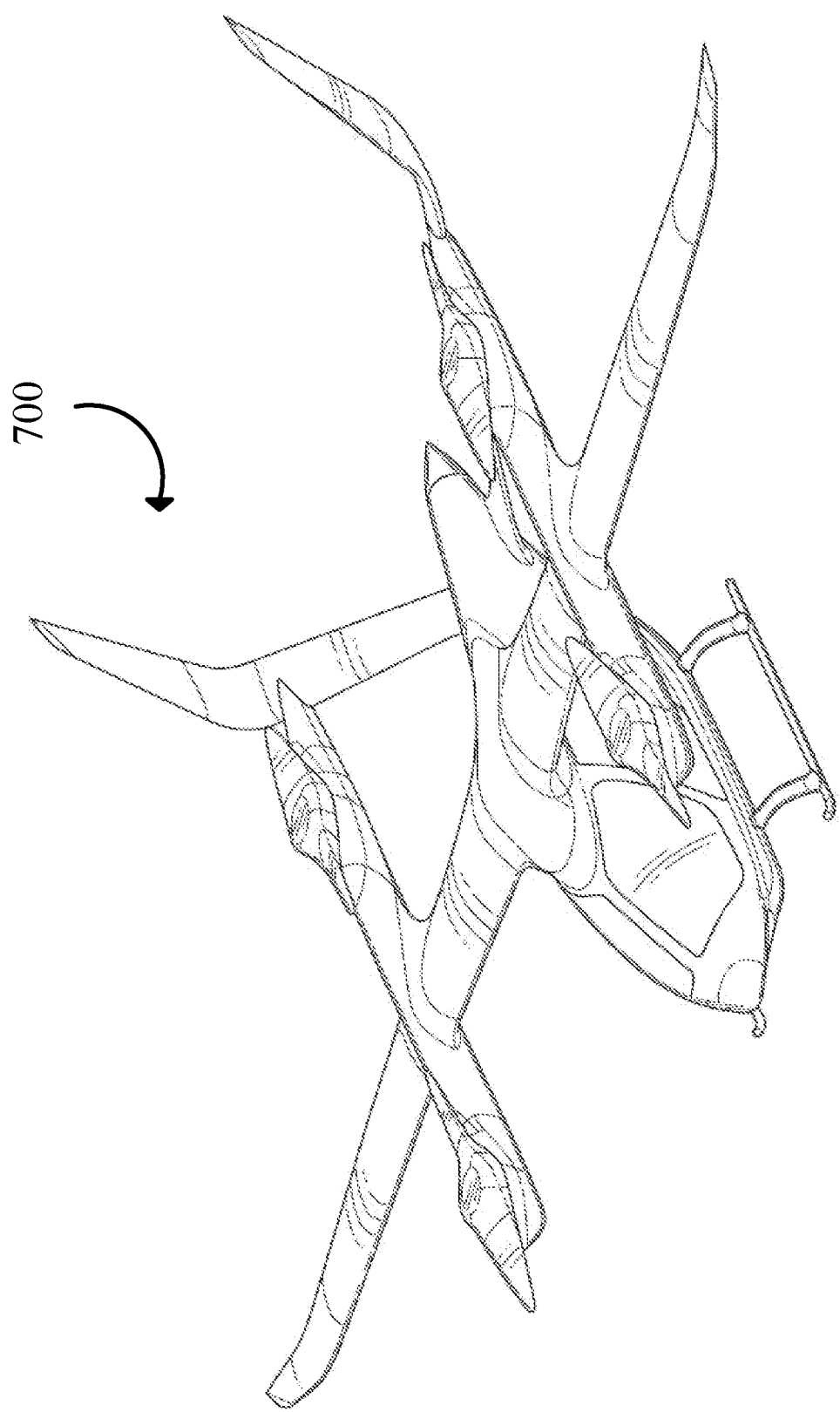
FIG. 7 is an illustration of an embodiment of an electric aircraft in one or more aspect of the present disclosure.

Referring now to FIG. 7, an embodiment of an electric aircraft 700 is presented in accordance with one or more embodiments of the present disclosure. Electric aircraft 700 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
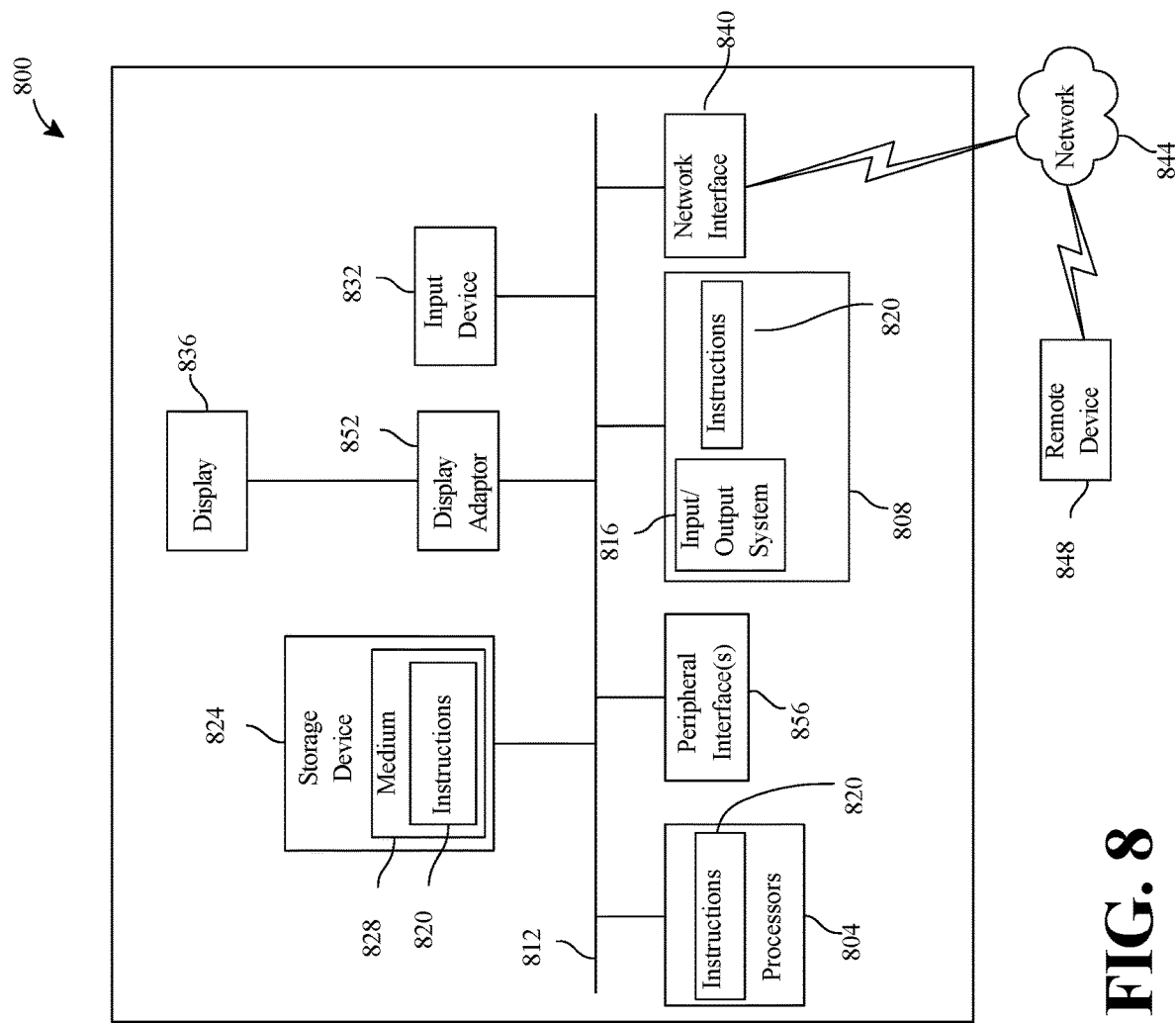
FIG. 8 is a block diagram of a computing system that can be used to implement any one or more of the methodologies disclosed herein and any one or more portions thereof.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 894 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve embodiments according to this disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A battery pack for an electric aircraft, the battery pack comprising:
   a battery module configured to provide energy to an electric aircraft via a power supply connection; and
   a battery management component, the battery management component comprising:
      a module monitor unit mechanically connected and communicatively connected to the battery module, wherein the module monitor unit is configured to transmit a measurement datum of the battery module;
      a pack monitoring unit communicatively connected to the module monitor unit, wherein the pack monitoring unit comprises a controller configured to:
         receive a measurement datum from the module monitor unit;
         identify an operating condition of the battery module as a function of the measurement datum;
         determine a critical event element if the operating condition is outside of a predetermined threshold; and
         generate an action command if the critical event element is determined; and
      disconnect device communicatively connected to the battery module wherein the disconnect device is configured to terminate the power supply connection between the battery module and the electric aircraft in response to receiving the action command from the pack monitoring unit.

2. The battery pack of claim 1, wherein the module monitor unit is further configured to provide load-sharing between a plurality of battery cells of the battery module during charging of the battery module.

3. The battery pack of claim 1, wherein the pack monitoring unit comprises a memory component configured to store the measurement datum from the module monitor unit.

4. The battery pack of claim 1, wherein the module monitor unit comprises a sensor configured to detect a condition characteristic of the battery module, wherein the module monitor unit is configured to generate the measurement datum as a function of the condition characteristic.

5. The battery pack of claim 1, wherein the battery module comprises a battery cell.

6. The battery pack of claim 1, wherein the battery management component comprises a plurality of pack monitoring units, wherein the pack monitoring units are physically isolated from each other for redundancy.

7. The battery pack of claim 1, wherein the predetermined threshold comprises an upper voltage threshold.

8. The battery pack of claim 7, wherein the controller determines the critical event element when the operating condition comprises a voltage of the battery module that exceeds the upper voltage threshold.

9. The battery pack of claim 1, wherein the predetermined threshold comprises a lower voltage threshold.

10. The battery pack of claim 1, wherein the battery management system detects byproducts of cell failure.

11. A method of battery pack management, the method comprising:
    identifying, by a controller of a pack monitoring unit, an operating condition of a battery module as a function of a measurement datum of the battery module received from a module monitor unit, wherein the battery module is configured to provide energy to an electric aircraft via a power supply connection;
    determining, by the controller, a critical event element if the operating condition is outside of a predetermined threshold;
    generating, by the controller, an action command if the critical event element is determined; and
    terminating, by a disconnect device, the power supply connection between the battery module and the electric aircraft in response to receiving the action command from the pack monitoring unit.

12. The method of claim 11, wherein the module monitor unit is further configured to provide load-sharing between a plurality of battery cells of the battery module during charging of the battery module.

13. The method of claim 11, wherein the pack monitoring unit comprises a memory component configured to store the measurement datum from the module monitor unit.

14. The method of claim 11, wherein the module monitor unit comprises a sensor configured to detect a condition characteristic of the battery module, wherein the module monitor unit is configured to generate the measurement datum as a function of the condition characteristic.

15. The method of claim 11, wherein the battery module comprises a battery cell.

16. The method of claim 11, wherein the method further comprises providing a plurality of pack monitoring units, wherein the pack monitoring units are physically isolated from each other for redundancy.

17. The method of claim 11, wherein the predetermined threshold comprises an upper voltage threshold.

18. The method of claim 17, wherein the controller determines the critical event element when the operating condition comprises a voltage of the battery module that exceeds the upper voltage threshold.

19. The method of claim 11, wherein the predetermined threshold comprises a lower voltage threshold.

20. The method of claim 11, wherein the method further comprises detecting byproducts of cell failure.

* * * * *